US012136560B1

(12) United States Patent
Aranami et al.

(10) Patent No.: US 12,136,560 B1
(45) Date of Patent: Nov. 5, 2024

(54) WORKPIECE TRANSFER APPARATUS

(71) Applicant: TAKAOKA TOKO CO., LTD., Tokyo (JP)

(72) Inventors: Taichi Aranami, Shizuoka (JP); Shohei Suzuki, Shizuoka (JP)

(73) Assignee: TAKAOKA TOKO CO., LTD, Tokyo (JP)

( * ) Notice: Subject to any disclaimer, the term of this patent is extended or adjusted under 35 U.S.C. 154(b) by 0 days.

(21) Appl. No.: 18/648,595

(22) Filed: Apr. 29, 2024

Related U.S. Application Data

(63) Continuation of application No. PCT/JP2023/014883, filed on Apr. 12, 2023.

(51) Int. Cl.
*H01L 21/677* (2006.01)
*G01N 21/95* (2006.01)

(52) U.S. Cl.
CPC ... *H01L 21/67721* (2013.01); *G01N 21/9501* (2013.01); *H01L 21/6773* (2013.01)

(58) Field of Classification Search
CPC ................ G01N 21/9501; H01L 21/67721
See application file for complete search history.

(56) References Cited

U.S. PATENT DOCUMENTS

| 10,254,214 B1 | 4/2019 | Griffith et al. |
| 11,125,677 B2 | 9/2021 | Griffith et al. |
| 2002/0011836 A1 | 1/2002 | Ito et al. |
| 2011/0141448 A1* | 6/2011 | Aoki ................ H01L 21/67706 355/72 |
| 2019/0257741 A1 | 8/2019 | Griffith et al. |
| 2020/0333261 A1* | 10/2020 | Sugiyama ......... H01L 21/67259 |

FOREIGN PATENT DOCUMENTS

| CN | 110856848 A | 3/2020 |
| JP | H09-152466 A | 6/1997 |
| JP | H10-232262 A | 9/1998 |
| JP | H11-67855 A | 3/1999 |
| JP | 003136613 B2 | 2/2001 |
| JP | 2003-114251 A | 4/2003 |
| JP | 2008-182061 A | 8/2008 |

(Continued)

OTHER PUBLICATIONS

Notification of Reasons for Refusal issued in Japanese Patent Application No. 2023-545378 mailed on Oct. 10, 2023 with English Translation (10 pages).

(Continued)

*Primary Examiner* — Gerald McClain
(74) *Attorney, Agent, or Firm* — Nakanishi IP Associates, LLC (57) ABSTRACT

A workpiece transfer apparatus includes a loader for loading a tray with uninspected workpieces placed thereon, a first-transferer for guiding the workpieces toward a first-inspection region by transferring the loaded tray in a first direction, a second-transferer for guiding the workpieces toward a second-inspection region by transferring the tray in a second-direction perpendicular to the first-direction, a third-transferer for transferring the tray with the inspected workpieces placed thereon in a third direction perpendicular to the second-direction, and an unloader for unloading the tray.

2 Claims, 10 Drawing Sheets

(56) References Cited

FOREIGN PATENT DOCUMENTS

| | | |
|---|---|---|
| JP | 2009-295814 A | 12/2009 |
| JP | 2012-028628 A | 2/2012 |
| JP | 2015-097292 A | 5/2015 |
| JP | 2019-045231 A | 3/2019 |
| JP | 2022-183851 A | 12/2022 |
| KR | 10-1275134 B1 | 6/2013 |
| KR | 10-1487278 B1 | 1/2015 |
| TW | 201913863 A | 4/2019 |
| TW | 202238821 A | 10/2022 |
| WO | 2019/164695 A1 | 8/2019 |

OTHER PUBLICATIONS

Decision to Grant Patent issued in Japanese Patent Application No. 2023-545378 mailed on Nov. 14, 2023 with English Translation (5 pages).
Office Action issued in Taiwanese Patent Application No. 113109382 dated May 21, 2024, with English Translation (8 pages).

\* cited by examiner

WORKPIECE TRANSFER APPARATUS

CROSS-REFERENCE TO RELATED APPLICATIONS

This application is a Continuation Application of No. PCT/JP2023/014883, filed on Apr. 12, 2023, the entire contents of which are incorporated herein by reference.

TECHNICAL FIELD

The present invention relates to a workpiece transfer apparatus and a workpiece inspection apparatus, both of which are configured as an in-tray type to inspect workpieces in the state of being placed on a tray.

BACKGROUND

Inspection of semiconductor packages and/or chips after being cut into multiple pieces and separated from a wafer can be roughly classified into the following two methods. The first one is an in-tray method in which a workpiece as an inspection target is inspected in the state of being placed on a tray for placing workpieces thereon (for example, Patent Document 1). The second one is a pick-and-place method in which the workpiece is unloaded from the tray so as to be placed on an inspection table and be inspected and then is loaded onto the tray again after the inspection (for example, Patent Document 2).

PRIOR ART DOCUMENT

Patent Document

[Patent Document 1] JP 2009-295814 A
[Patent Document 2] JP 2003-114251 A

SUMMARY

Problem to be Solved by Invention

The pick-and-place method requires replacement work in which the workpiece to be inspected is loaded onto the tray and unloaded from the tray. Thus, there is a problem that this replacement work takes a lot of time and reduces throughput. The in-tray method can overcome the above-described problem of the pick-and-place method.

In the in-tray method of the prior invention, workpieces are inspected by scanning with the use of an inspection device that is suspended from an X-Y stage fixed to the ceiling. However, as the inspection device becomes larger in size and heavier, it becomes more difficult to hang the inspection device from the ceiling.

For this reason, when the inspection device becomes larger and heavier, it may be considered to place the inspection device on an X-Y stage fixed with respect to the floor surface. In this case, however, the X-Y stage is fixed to the floor surface on the side of the tray transport line, and receives a large bending moment from the inspection device by which scanning is performed directly above the transport line. In order to withstand such a bending moment, the support structure of the X-Y stage fixed to the floor surface is required to be strengthened, which causes a problem that it unavoidable to increase the size of the workpiece inspection apparatus. As the workpiece inspection apparatus becomes larger in size, the transport line needs to be designed longer by the increment in size of the workpiece inspection apparatus.

Further, in the in-tray method, a workpiece inspection region is set in the middle of the tray transport path. In conventional workpiece transfer apparatus, the transport path is linear, which greatly limits the design and/or layout of the workpiece transfer apparatus as a problem.

In view of the above-described circumstances, an object of the present invention is to provide: a workpiece inspection apparatus that does not need to be increased in size even in the case of applying a large inspection device; and a workpiece transfer apparatus that improves the freedom of design and/or layout of this workpiece inspection apparatus.

Solution to Problem

A workpiece transfer apparatus according to the present invention includes: a loader configured to load a tray on which a workpiece before inspection is placed; a first transferer configured to guide the workpiece toward a first inspection region by transferring the loaded tray in a first direction; a second transferer configured to guide the workpiece toward a second inspection region by transferring the tray in a second direction perpendicular to the first direction; a third transferer configured to transfer the tray with the workpiece after inspection placed thereon in a third direction perpendicular to the second direction; and an unloader configured to unload the tray.

Effect of Invention

The present invention provides a workpiece inspection apparatus that does not need to be increased in size even in the case of applying a large inspection device, and also provides a workpiece transfer apparatus that improves the freedom of design and/or layout of this workpiece inspection apparatus.

DETAILED DESCRIPTION

First Embodiment

Hereinbelow, embodiments of the present invention will be described by using the accompanying drawings.

Figure 1:
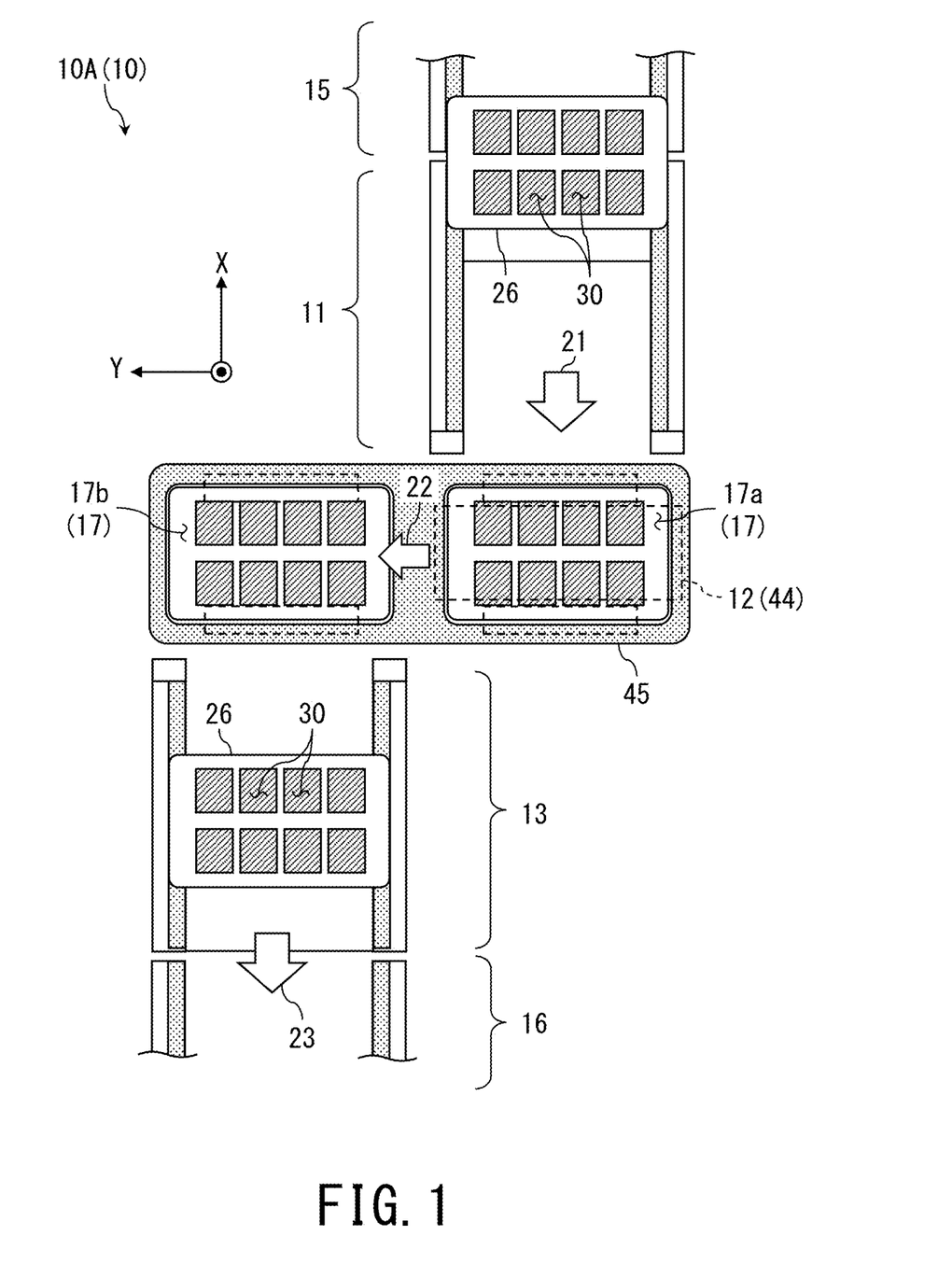
FIG. 1 is a Y-X top view of a workpiece transfer apparatus according to the first embodiment of the present invention.

FIG. 1 is a Y-X top view of a workpiece transfer apparatus 10A (10) according to the first embodiment of the present invention. The workpiece transfer apparatus 10A includes: a loader 15 configured to load a tray 26 on which workpieces 30 before inspection are placed; a first transferer 11 configured to guide the loaded tray 26 with the workpieces 30 placed thereon toward a first inspection region 17a by transferring the tray 26 in a first direction 21; a second transferer 12 configured to guide the tray 26 with the workpieces 30 placed thereon toward a second inspection region 17b by transferring the tray 26 in a second direction 22 perpendicular to the first direction 21; a third transferer 13 configured to transfer the tray 26 with the workpieces 30 after inspection placed thereon in a third direction 23 perpendicular to the second direction 22; and an unloader 16 configured to unload the tray 26.

Each of FIG. 2A, FIG. 3A, FIG. 4A, and FIG. 5A is a Y-X top view of the workpiece transfer apparatus 10A according to the first embodiment for illustrating its operation. Each of FIG. 2B, FIG. 3B, FIG. 4B, and FIG. 5B is a Z-X front view for illustrating the same. Each of FIG. 2C, FIG. 3C, FIG. 4C, and FIG. 5C is a Y-Z side view for illustrating the same.

The first transferer 11 and the third transferer 13 have a common configuration and include: a conveyor 41 configured to transfer the tray 26 from one end to the other end; and a carriage 42 configured to move the conveyor 41 in the direction toward the first inspection region 17a or the second inspection region 17b. The first transferer 11 with the above-described configuration transfers the tray 26, which is loaded from the loader 15 and carries the uninspected workpieces 30 placed thereon, in the first direction 21 so as to guide the tray 26 with the workpieces 30 placed thereon to the first inspection region 17a. The third transferer 13 transfers the tray 26, which carries the inspected workpieces 30 placed thereon and has left the second inspection region 17b, in the third direction 23 so as to unload it.

The conveyor 41 is configured by arranging carriers composed of belts, plastic chains, or the like in two rows. The tray 26 with the workpieces 30 two-dimensionally arranged thereon moves in the state of being supported at both ends by the conveyor 41.

The loader 15 and the unloader 16 have a common configuration. The loader 15 loads the tray 26, on which the workpieces 30 before inspection are placed, onto one end of the first transferer 11. The unloader 16 receives the tray 26, on which the workpieces 30 after inspection are placed, from the third transferer 13 and unloads it. Although the loader 15 and the unloader 16 are illustrated as a belt conveyor type, both are not particularly limited to such a type and may be operated manually.

Figure 4C:
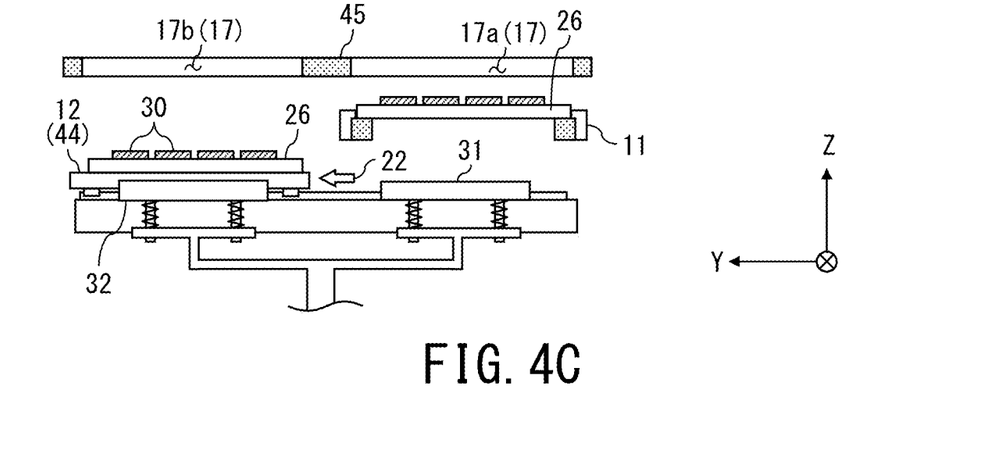
Figure 5A:
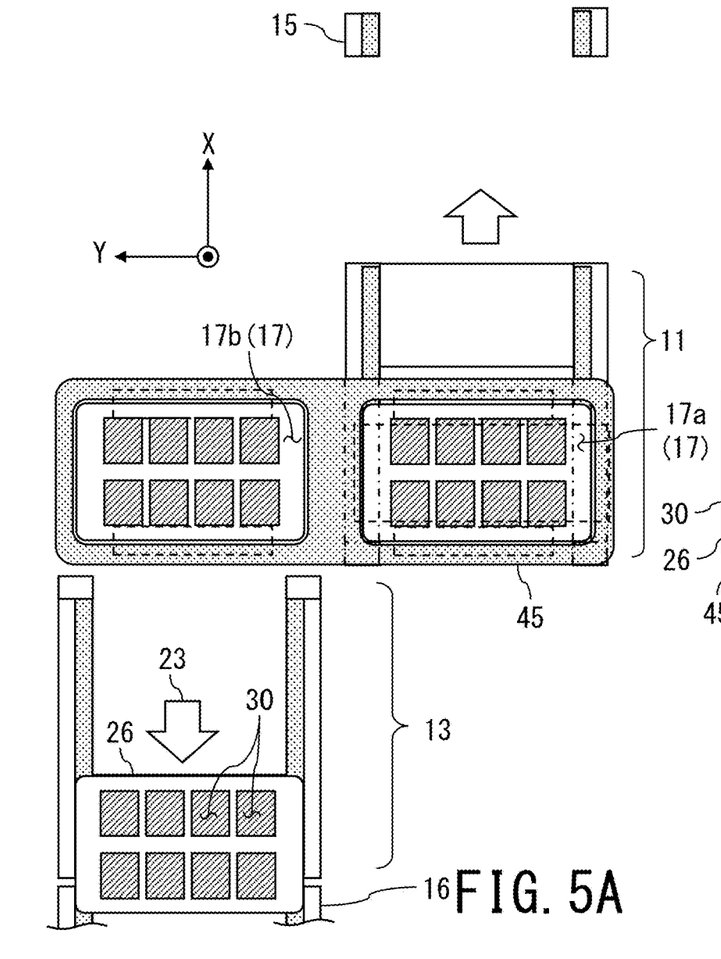
FIG. 5A, FIG. 5B, and FIG. 5C are a Y-X top view, a Z-X front view, and a Y-Z side view for illustrating the operation of the workpiece transfer apparatus according to the first embodiment, respectively.
Figure 5B:
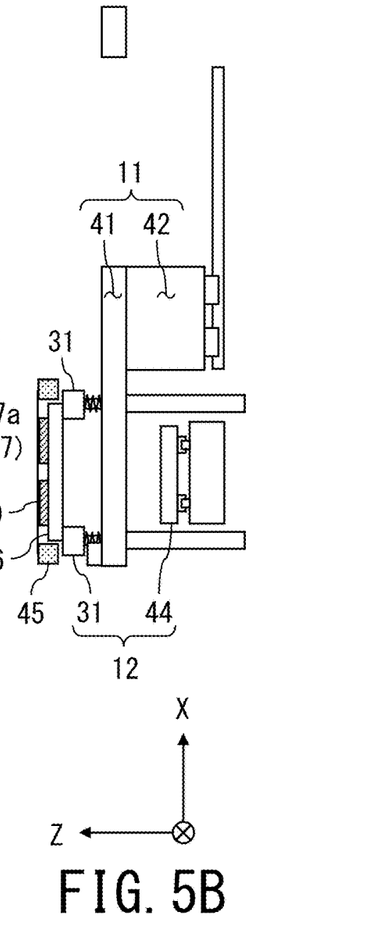
Figure 5C:
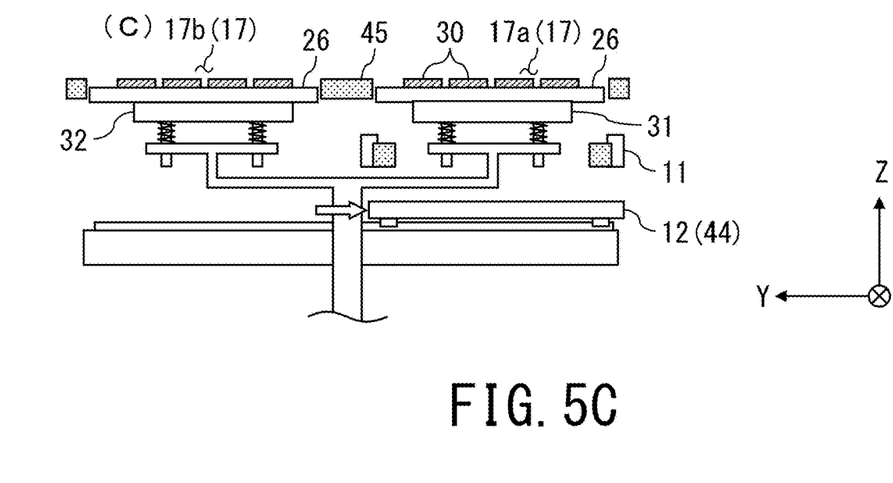

As shown in FIG. 5A to FIG. 5C, the second transferer 12 includes: a first bias applier (e.g., spring) 31 configured to position the tray 26 from the first transferer 11 to the first inspection region 17a by biasing the bottom surface; a mover 44 configured to load the tray 26 released from the bias onto itself and guide the tray from the first inspection region 17a to the second inspection region 17b; and a second bias applier (e.g., spring) 32 configured to position the tray 26 from the mover 44 to the second inspection region 17b by biasing the bottom surface. As shown in FIG. 2C, FIG. 3C, FIG. 4C, and FIG. 5C, the first bias applier 31 and the second bias applier 32 are synchronized in timing of applying and releasing the bias with respect to each of the corresponding trays 26.

In addition to that the second transferer 12 loads the tray 26 onto itself and transfers the tray 26 in the second direction 22 from the first inspection region 17a to the second inspection region 17b, the second transferer 12 is returned in the state of being empty in the direction from the second inspection region 17b toward the first inspection region 17a, i.e., in the direction opposite to the second direction 22. On the upper side of the second transferer 12, a frame 45 partitioning the first inspection region 17a and the second inspection region 17b is provided.

Figure 6A:
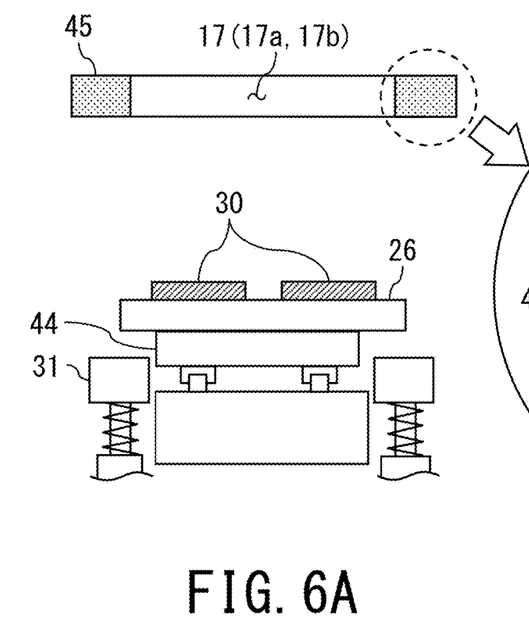
FIG. 6A is a front view illustrating a state in which a tray is removed from an inspection region by releasing bias to its bottom surface.

FIG. 6A is a front view illustrating a state in which the tray 26 is removed from the inspection region 17 by releasing the bias to the bottom surface.

Figure 6B:
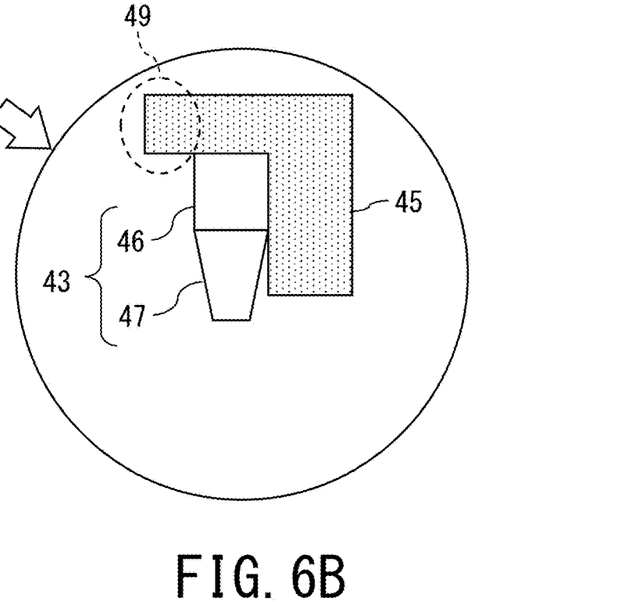
FIG. 6B is an enlarged view of the periphery of positioning pin for the tray.

FIG. 6B is an enlarged view of the periphery of the positioning pin 43 for the tray 26.

Figure 7A:
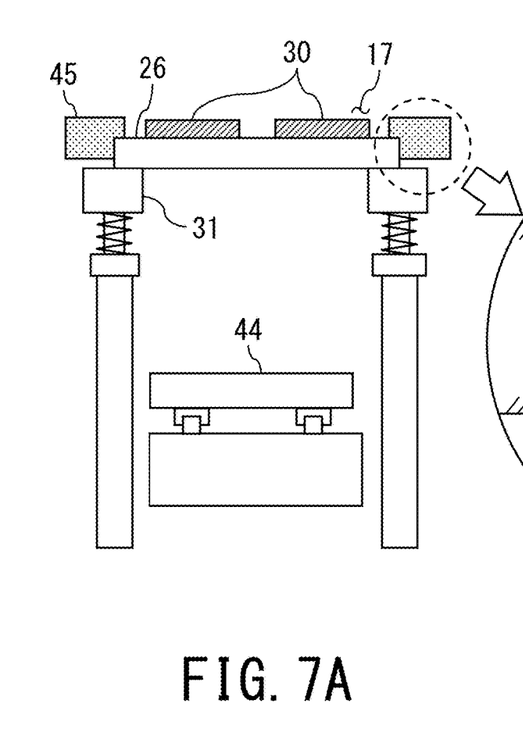
FIG. 7A is a front view illustrating a state in which the bottom surface of the tray is biased and the tray is positioned in the inspection region.

FIG. 7A is a front view illustrating a state in which the bottom surface of the tray 26 is biased and the tray 26 is positioned in the inspection region 17.

Figure 7B:
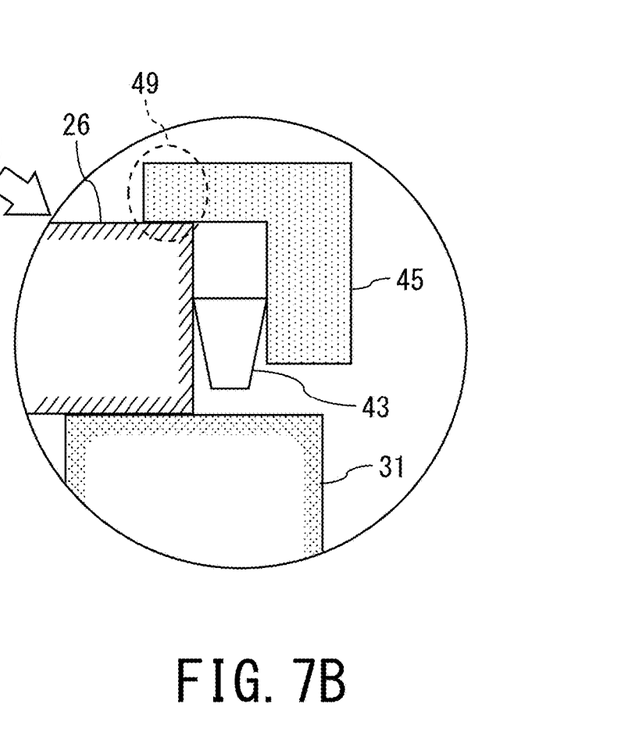
FIG. 7B is an enlarged view of the periphery of the positioning pin for the tray.

FIG. 7B is an enlarged view of the periphery of the positioning pin 43 for the tray 26.

On the frame 45, a notch 49 is formed. This notch 49 defines the height position of the tray 26 positioned in the first inspection region 17a or the second inspection region 17b. On the frame 45, a plurality of pins 43 for positioning the tray 26 are also provided.

Each pin 43 is composed of a body portion 46 connected to the frame 45 and a tapered portion 47. Of the body portion 46, the side circumferential surface having a constant outer diameter abuts against the periphery of the tray 26 so as to define the planar position of the tray 26. Of the tapered portion 47, the conical surface formed by narrowing the outer diameter from the body portion 46 toward its tip slides into contact with the periphery of the tray 26 so as to guide the tray 26 to the inspection region 17.

Figure 8:
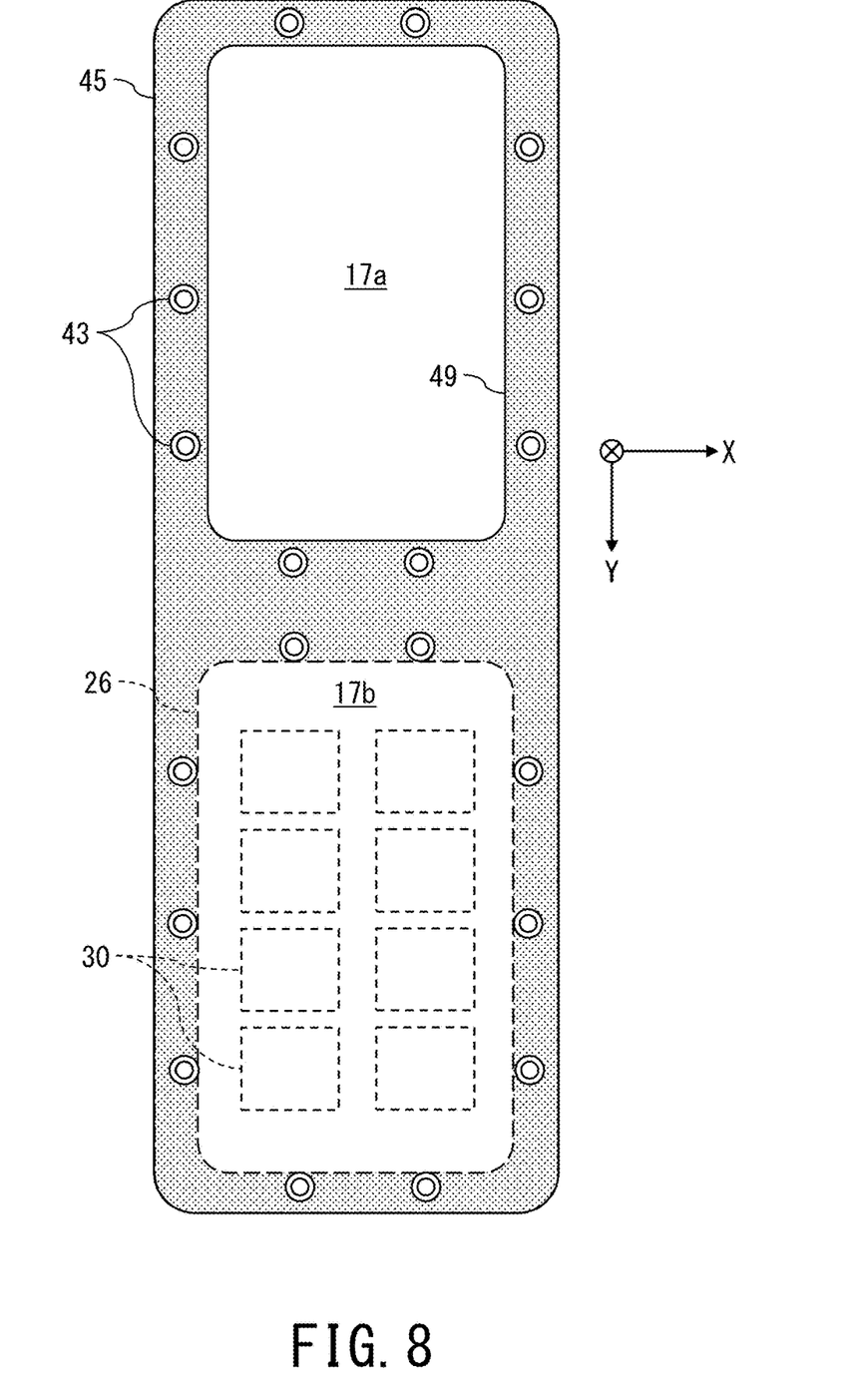
FIG. 8 is an X-Y bottom view of a frame that defines a first inspection region and a second inspection region.

FIG. 8 is an X-Y bottom view of the frame 45 that defines the inspection region 17 (i.e., the first inspection region 17a and the second inspection region 17b). The positioning pins 43 for the tray 26 are arranged so as to surround the outer peripheries of the first inspection region 17a and the second inspection region 17b. The notch 49 defining the height position of the tray 26 does not need to be provided uniformly around the outer periphery of the inspection region 17 (17a and 17b) but may be provided near the positioning pins 43 or may be integrated with the positioning pins 43.

Figure 9:
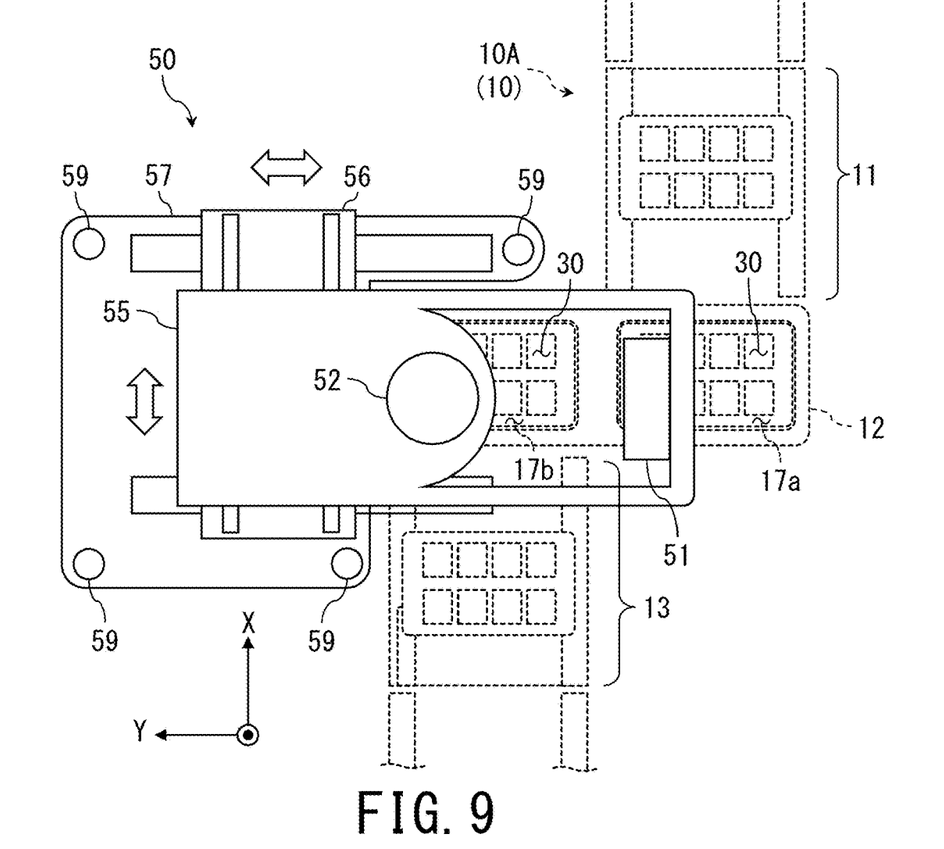
FIG. 9 is a Y-X top view of a workpiece inspection apparatus according to the second embodiment of the present invention.
Figure 10:
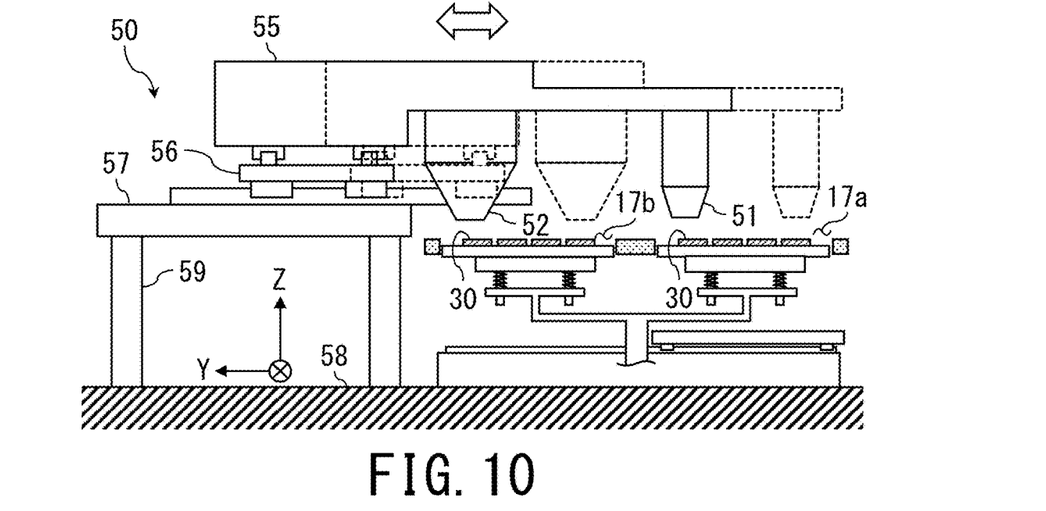
FIG. 10 is a Y-Z side view of the workpiece inspection apparatus according to the second embodiment of the present invention.

FIG. 9 is a Y-X top view of a workpiece inspection apparatus 50 according to the second embodiment of the present invention. FIG. 10 is a Y-Z side view of this workpiece inspection apparatus 50.

The workpiece inspection apparatus 50 includes: a first inspection device 51 that inspects the workpieces 30 in the first inspection region 17a; a second inspection device 52 that inspects the workpieces 30 in the second inspection region 17b; a housing 55 that accommodates the first inspection device 51 and the second inspection device 52 at the same arrangement interval as the arrangement interval between the first inspection region 17a and the second inspection region 17b; a stage 56 that displaces the housing 55 by the same interval as the arrangement interval between the workpieces 30 on the tray 26; and a supporting body 57 that supports this stage 56 and is fixed to the floor surface 58.

In the workpiece inspection apparatus 50, supporting pillars 59 for fixing the supporting body 57 to the floor surface 58 are provided asymmetrically between the side of the first transferer 11 and the side of the third transferer 13 by providing a larger number of supporting pillars 59 on one side of the second transferer 12. Furthermore, the transfer direction of the second transferer 12 configured to reciprocate between the first inspection region 17a and the second inspection region 17b is perpendicular to the transfer direction of the first transferer 11 and the third transferer 13. This configuration allows the supporting body 57 and the stage 56 to be smaller in size and more rigid, and thus contributes to prevention of increase in width of the workpiece inspection apparatus 50 that directly faces the transfer direction (i.e., the X-axis direction) of the tray 26 to be loaded and unloaded.

Returning to FIG. 2A to FIG. 5C, the operation of the workpiece transfer apparatus 10 and the workpiece inspection apparatus 50 according to the embodiment will be described.

Figures 2A, 2B:
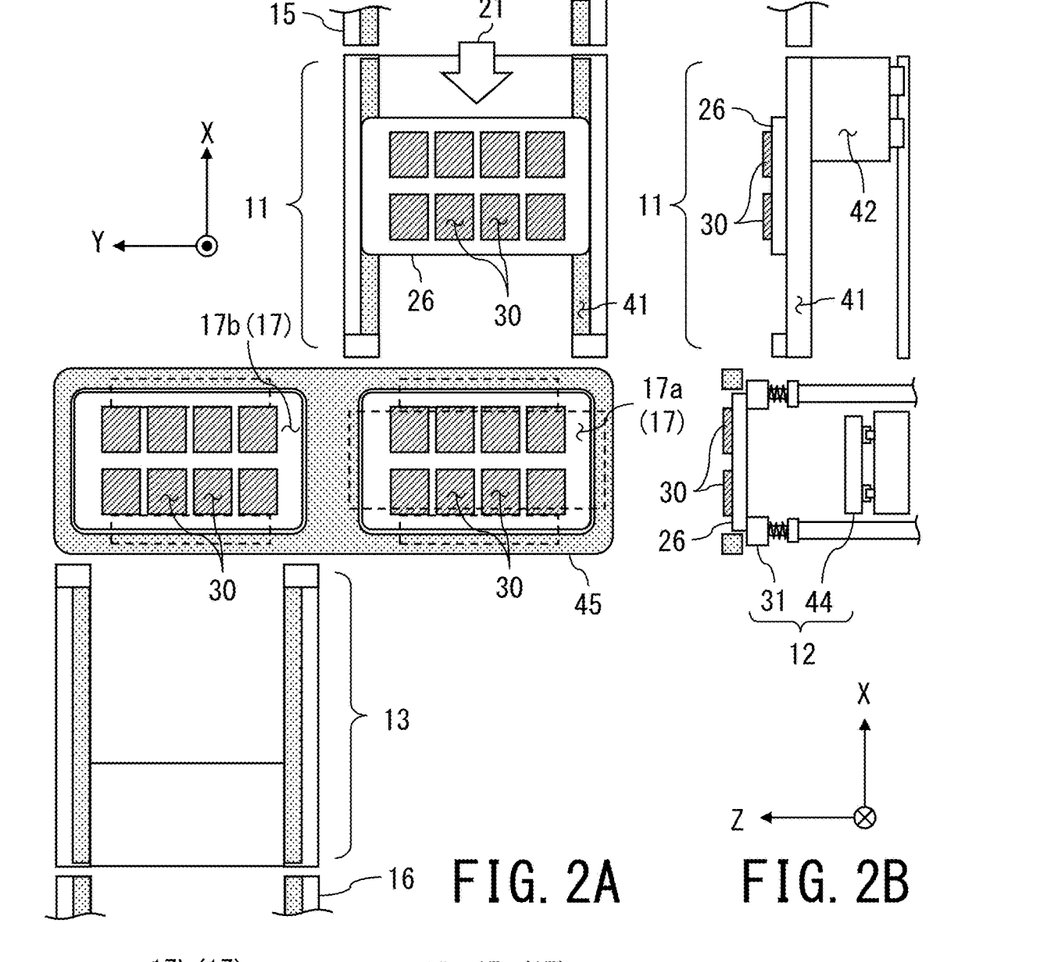
FIG. 2A, FIG. 2B, and FIG. 2C are a Y-X top view, a Z-X front view, and a Y-Z side view for illustrating the operation of the workpiece transfer apparatus according to the first embodiment, respectively.
Figure 2C:
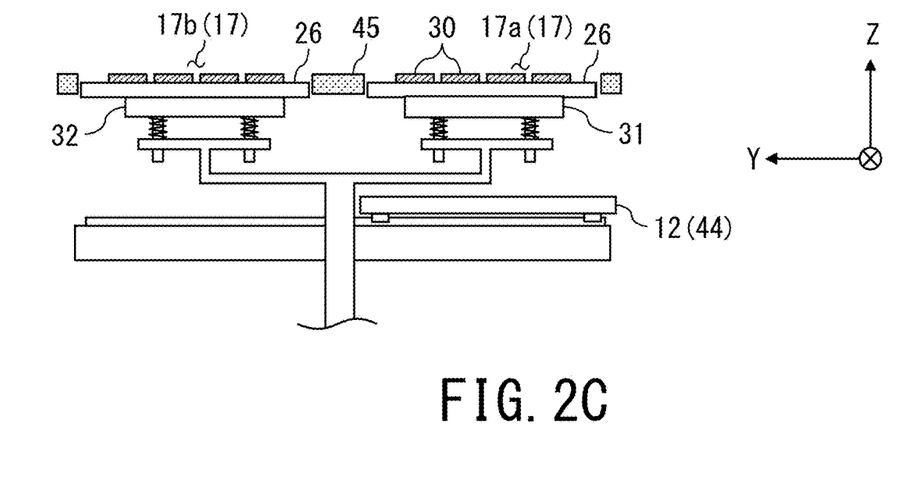

First, as shown in FIG. 2A to FIG. 2C, in the first inspection region 17a and the second inspection region 17b, the first inspection device 51 and the second inspection device 52 (FIG. 9 and FIG. 10) are displaced by the same interval as the arrangement interval between the workpieces 30 such that the workpieces 30 are inspected. At this time, the second transferer 12 raises the bias appliers 31 and 32 so as to bias and position the trays 26 with respect to the first inspection region 17a and the second inspection region 17b.

Further, another tray 26 with the pre-inspection workpieces 30 arranged thereon is loaded by the loader 15 to one end of the first transferer 11, and then, the first transferer 11 causes the conveyor 41 to transfer this tray 26 from one end to the other end. At the other end of the first transferer 11, this tray 26 is kept in a standby state until the inspection of the workpieces 30 arranged on the trays 26 in the inspection region 17 is completed.

Figure 3A:
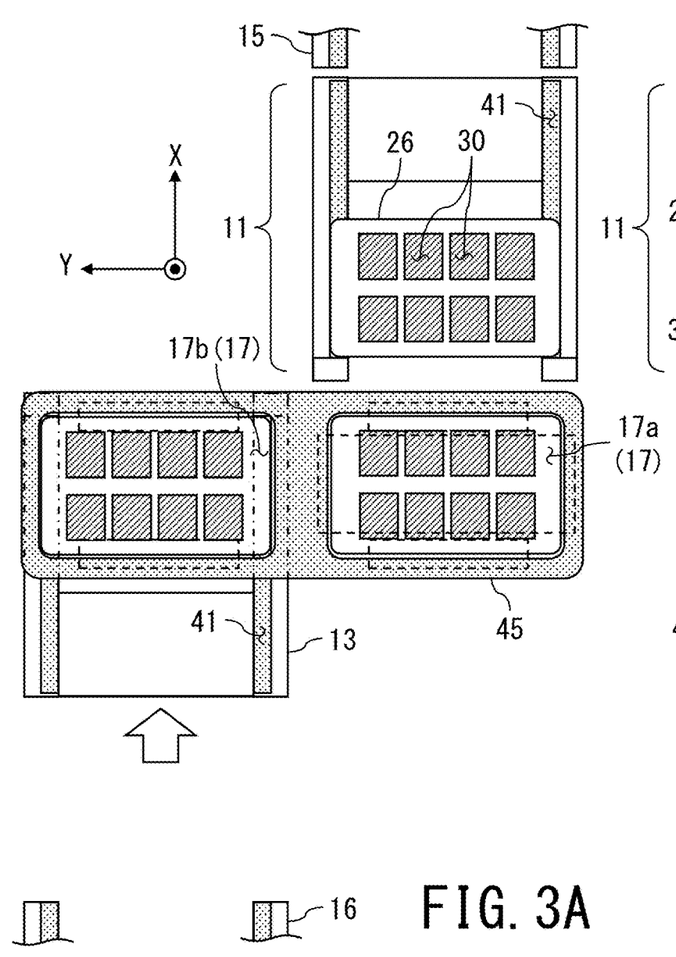
FIG. 3A, FIG. 3B, and FIG. 3C are a Y-X top view, a Z-X front view, and a Y-Z side view for illustrating the operation of the workpiece transfer apparatus according to the first embodiment, respectively.
Figure 3B:
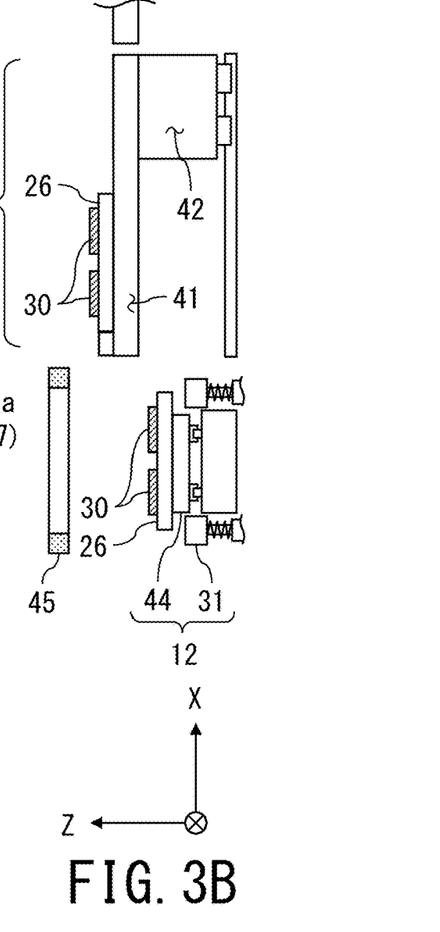
Figure 3C:
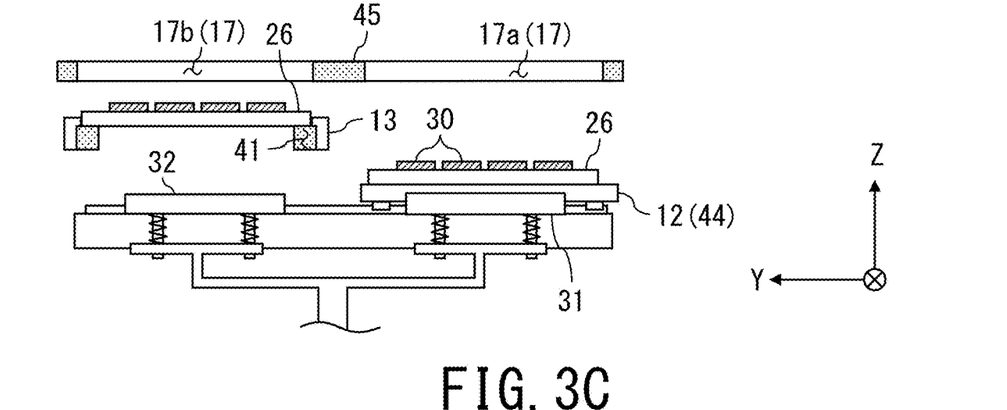

Next, as shown in FIG. 3A to FIG. 3C, at the time when (or by the time when) the inspection for the trays 26 in the inspection region 17 is completed, the third transferer 13 is moved in the direction opposite to the third direction 23 such that the empty conveyor 41 is positioned below the second inspection region 17b. Further, the bias appliers 31 and 32 are lowered to release the bias, and the trays 26 are removed from the inspection regions 17a and 17b, and thereby, the tray 26 in the first inspection region 17a is placed on the mover 44 whereas the tray 26 in the second inspection region 17b is placed on the conveyor 41 of the third transferer 13.

Figure 4A:
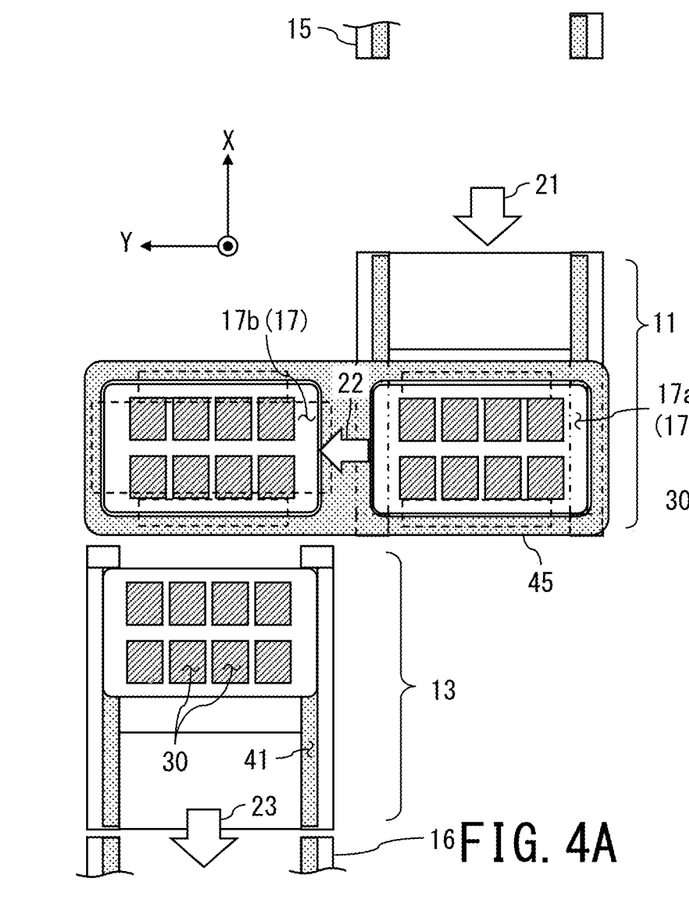
FIG. 4A, FIG. 4B, and FIG. 4C are a Y-X top view, a Z-X front view, and a Y-Z side view for illustrating the operation of the workpiece transfer apparatus according to the first embodiment, respectively.
Figure 4B:
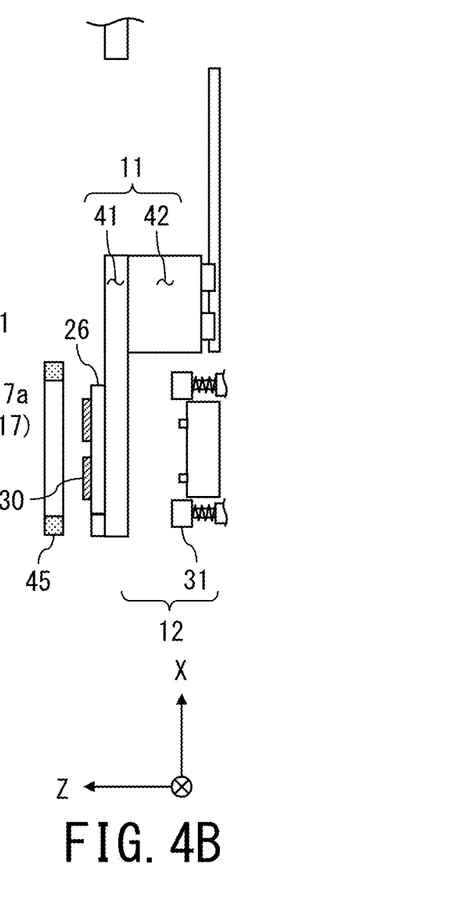

Next, as shown in FIG. 4A to FIG. 4C, the third transferer 13 is moved in the third direction 23 so as to be brought closer to the unloader 16. At the same time with this, the mover 44 moves in the second direction 22 from directly below the first inspection region 17a and transfers the tray 26 loaded onto itself to the position immediately below the second inspection region 17b. Furthermore, at the same time with this, the first transferer 11 is moved in the first direction 21, and thereby, the conveyor 41 carrying the tray 26 with the pre-inspection workpieces 30 placed thereon is positioned below the first inspection region 17a. These three actions are performed simultaneously, and the state shown in FIG. 3A to FIG. 3C changes instantaneously to the state shown in FIG. 4A to FIG. 4C.

Next, as shown in FIG. 5A to FIG. 5C, in the second transferer 12, the bias appliers 31 and 32 are raised to bias and position the trays 26 with respect to the first inspection region 17a and the second inspection region 17b. At this time, due to the action of the positioning pins 43 (FIG. 6A to FIG. 7B), the trays 26 are accurately and stably fixed in terms of height position and planar position with respect to the respective first and second inspection regions 17a and 17b.

Next, the first transferer 11 is moved in the direction opposite to the first direction 21 so as to bring the empty conveyor 41 closer to the loader 15. At the same time with this, the mover 44 in the second transferer 12 moves in the empty state from the second inspection region 17b in the direction opposite to the second direction 22 (FIG. 4A to FIG. 4C), and returns to the position of the first inspection region 17a. The third transferer 13 operates the conveyor 41 so as to transfer the tray 26, which carries the inspected workpieces 30 arranged thereon and has left the second inspection region 17b, in the third direction 23 and unload the tray 26. These three actions are performed simultaneously, and the state shown in FIG. 5A to FIG. 5C changes instantaneously to the state shown in FIG. 2A to FIG. 2C. In this manner, the operation described on the basis of FIG. 2A to FIG. 5C is repeated, and thereby, the trays 26 with the pre-inspection workpieces 30 placed thereon are sequentially loaded, inspected, and unloaded.

Figure 11:
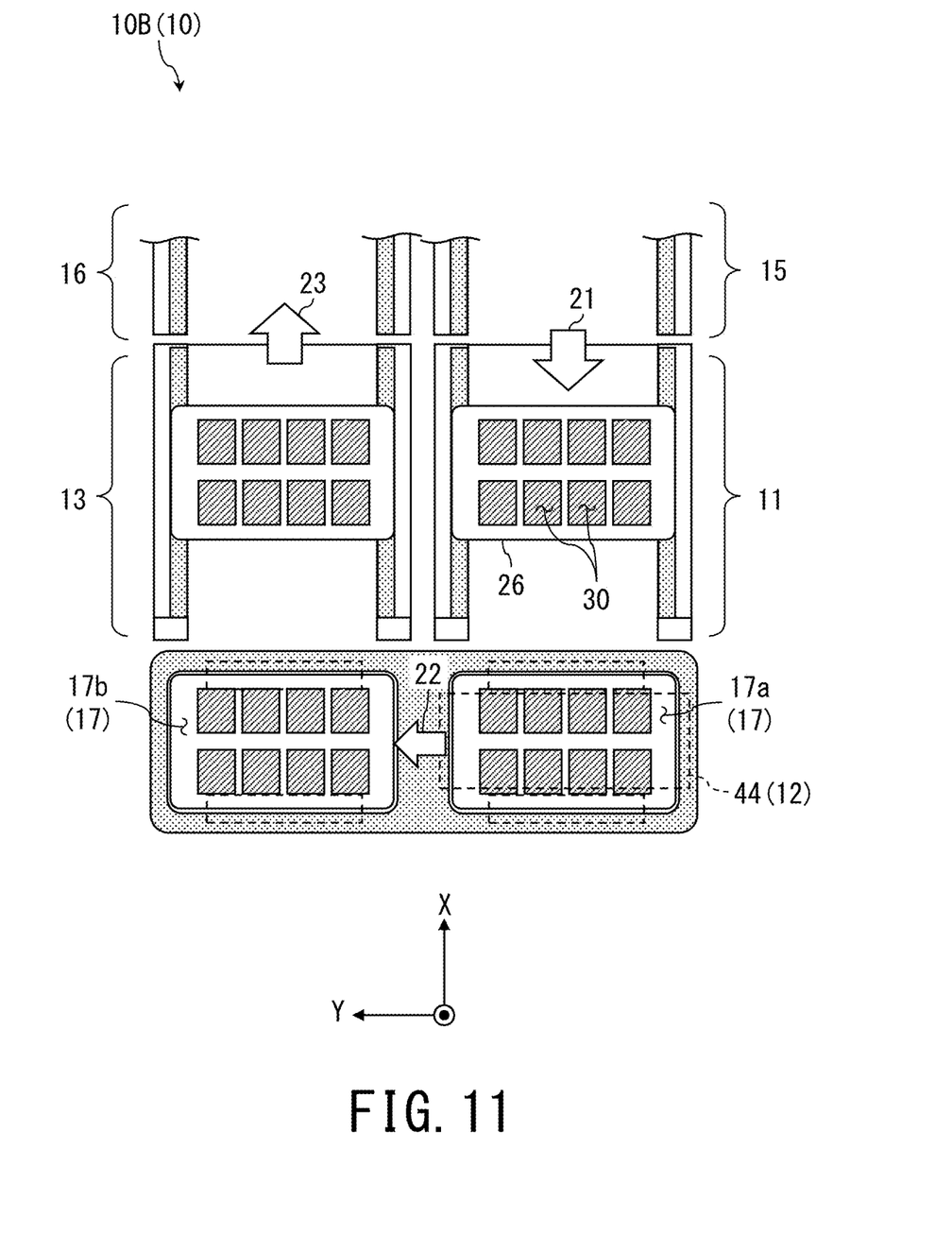
FIG. 11 is a Y-Z top view of the workpiece transfer apparatus according to the third embodiment of the present invention.

FIG. 11 is a Y-Z top view of a workpiece transfer apparatus 10B (10) according to the third embodiment of the present invention. The difference from the workpiece transfer apparatus 10A according to the first embodiment is that the third direction 23 in which the third transferer 13 transfers the tray 26 is in the opposite direction.

In this manner, aspects of the workpiece transfer apparatus 10 (10A, 10B) can be diversified by using a crank for the transport path of the tray 26 or reversing the transport path of the tray 26. As a result, the degree of freedom in design and/or layout of the workpiece inspection apparatus 50 can be improved as compared with the case where the transport path is linear.

Figure 12A:
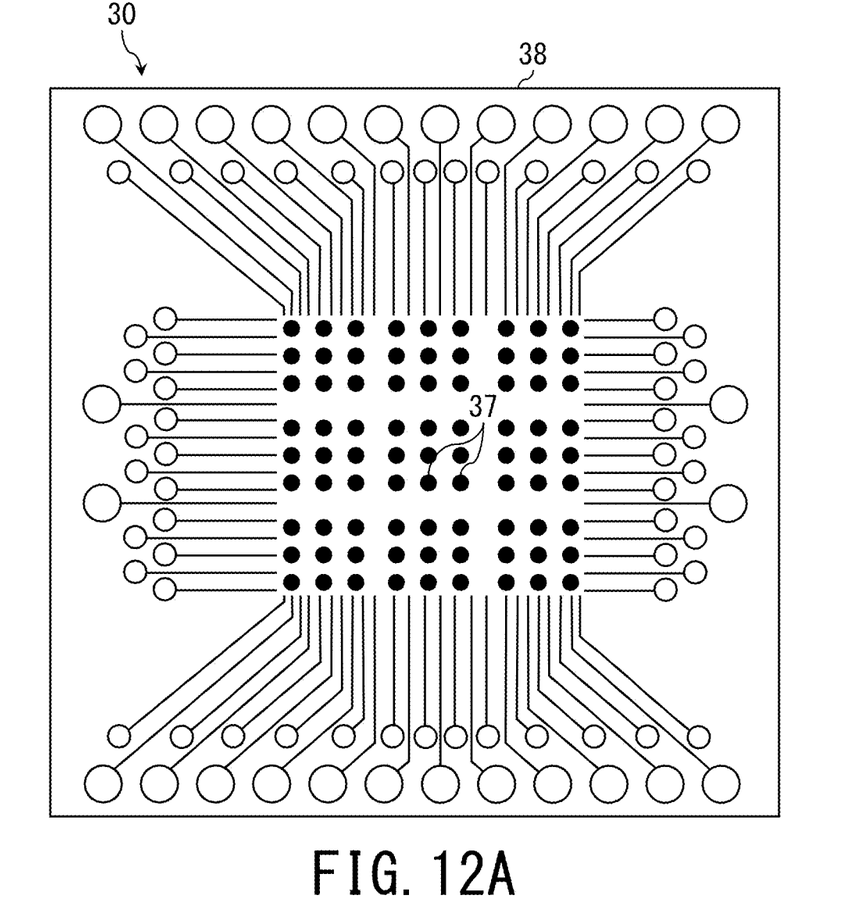
FIG. 12A is a top transparent view of a multi-layer wiring substrate, which is to be applied as a workpiece of the present embodiment and has bumps arrayed on its top surface.
Figure 12B:
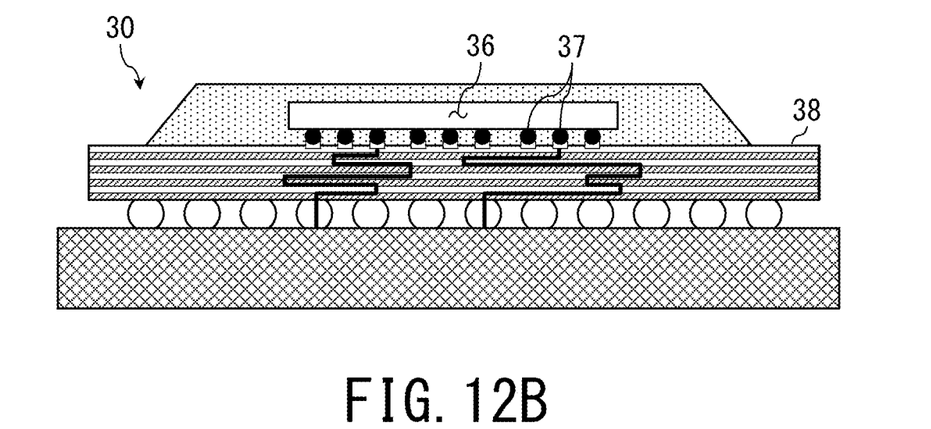
FIG. 12B is a side transparent view of an LSI package in which an LSI chip is mounted on the multi-layer wiring substrate.

FIG. 12A is a top transparent view of a multi-layer wiring substrate 38, which is to be applied as a workpiece 30 of the present embodiment and has bumps 37 arrayed on its top surface. FIG. 12B is a side transparent view of an LSI package in which an LSI chip 36 is mounted on the multi-layer wiring substrate 38. In this LSI package, electrodes of the multi-layer wiring substrate 38 and electrodes of the LSI chip 36 are electrically connected by the bumps 37. Further, the LSI package is packaged with resin as a countermeasure against deterioration and heat. This method of electrical connection using the ball-shaped bumps 37 is referred to as flip-chip packaging.

In the flip-chip packaging, the respective bumps 37 are required to be of equal height in order to directly overlap the electrodes of the multi-layer wiring substrate 38 and the electrodes of the LSI chip 36 with each other. This is because a connection failure occurs if there is variation in height of the bumps 37. Aside from that, it is required to detect defects such as bump positions, bump diameter, other bump shape abnormality, and foreign matters on the substrate. Although the workpiece 30 is illustrated as an LSI package in the embodiment, the workpiece 30 is not limited to this. It is applicable as long as the workpiece 30 can be placed on the tray 26.

In this case, the first inspection device 51 measures the relative height of the multi-layer wiring substrate 38, and the second inspection device 52 is a measurement/inspection device that measures various dimensions of the bumps 37 arranged on the top surface of the multi-layer wiring substrate 38 and detects foreign matters. Specifically, it is a measurement/inspection instrument that has an image measuring instrument and a surface-profile measuring instrument using light or functions of both and can measure surface unevenness information.

In general, variation in the top-surface height of the multi-layer wiring substrate 38 is much larger than the variation in the size of the bumps 37. For this reason, the measurement range of the first inspection device 51 is set to be much larger than that of the second inspection device 52. Hence, an adjustment mechanism (not shown) configured to adjust the height direction of the frame 45 is provided in such a manner that the second inspection region 17*b* does not deviate from the measurement range of the second inspection device 52. The inspection devices 51 and 52 are not limited to a specific type. Any device configured to inspect the workpieces 30 can be appropriately adopted as the inspection device 51 or 52 regardless of whether it is a contact type or a non-contact type.

The invention claimed is:

1. A workpiece transfer apparatus comprising:
 a loader configured to load a tray on which a workpiece before inspection is placed;
 a first transferer configured to guide the workpiece toward a first inspection region by transferring the tray in a first direction;
 a second transferer configured to guide the workpiece toward a second inspection region by transferring the tray in a second direction perpendicular to the first direction;
 a third transferer configured to transfer the tray on which the workpiece after inspection is placed in a third direction perpendicular to the second direction; and
 an unloader configured to unload the tray, wherein:
 the second transferer comprises
  a first spring configured to position the tray from the first transferer to the first inspection region by biasing a bottom surface,
  a mover configured to load the tray released from bias and guide the tray from the first inspection region to the second inspection region, and
  a second spring configured to position the tray from the mover to the second inspection region by biasing the bottom surface; and
 the first spring and the second spring are synchronized in timing of applying and releasing the bias with respect to each of corresponding trays.

2. The workpiece transfer apparatus according to claim 1, wherein at least one of the first transferer and the third transferer comprises:
 a conveyor configured to transfer the tray from one end to another end; and
 a carriage configured to move the conveyor toward the first inspection region or the second inspection region.

* * * * *